United States Patent [19]

Waters

[11] Patent Number: 5,031,183
[45] Date of Patent: Jul. 9, 1991

[54] FULL APERTURE SEMICONDUCTOR LASER

[75] Inventor: Robert G. Waters, Florida, N.Y.

[73] Assignee: McDonnell Douglas Corporation, St. Louis, Mo.

[21] Appl. No.: 488,935

[22] Filed: Mar. 5, 1990

[51] Int. Cl.$^5$ .................................................. H01S 3/19
[52] U.S. Cl. ........................................ 372/45; 372/48; 372/50
[58] Field of Search ................... 372/50, 48, 45, 43

[56] References Cited

FOREIGN PATENT DOCUMENTS 0018189 1/1986 Japan ........................................ 372/50
0158381 7/1987 Japan ........................................ 372/50

Primary Examiner—Georgia Epps
Attorney, Agent, or Firm—Benjamin Hudson, Jr.; Timothy H. Courson; Guy R. Gosnell

[57] ABSTRACT

There is provided by this invention a semiconductor laser which achieves high-power operation due to full aperture emission from a broad emitting facet. The semiconductor laser's full aperture emission is enabled by the physical structure and alignment of the semiconductor layers which are deposited upon the corrugated substrate.

5 Claims, 1 Drawing Sheet

FULL APERTURE SEMICONDUCTOR LASER

BACKGROUND OF THE INVENTION

1. Field of the Invention

This invention relates generally to semiconductor laser device, and more particularly, to devices which achieve high-power operation due to full-aperture emission from a broad emitting facet while suppressing lateral amplified spontaneous emissions.

2. Brief Description of the Prior Art

Current laser applications are requiring large linear power densities which have been difficult to achieve heretofore. The output power of semiconductor laser devices is limited by catastrophic optical degradation of the laser facets which occurs at a given facet output power density. In order to increase the total maximum power it is therefore necessary to enlarge the emitter's surface area by increasing the width of the emitting facet. Generally, the width may only be increased until it approximately equals the cavity length at which time joule heating and competing radiative pathways being to impair the laser output.

Previous solutions to the output power limitations have included mechanical stacking and multielement or laser array schemes. Alternatively, prior attempts to reduce the competing radiative pathways, or amplified spontaneous emission, have sought to spoil the cavity in the lateral direction by chemical etching, regrowth, or proton bombardment. While these alternative solutions are successful, they require complex processing and stringent quality control and some of the processes are inherently damaging to the crystal.

An alternate method for decreasing the amplified spontaneous emission relies upon a nonplanar active region grown epitaxially upon a corrugated substrate. This method was proposed by M. E. Givens, et. al., of the University of Illinois, Applied Physics Letters, 53(13), p. 1159, September 1988, however this laser device failed to fill more than 40% of the aperture with the lasing occurring only at the steep steps between the planar regions due to an index-guiding mechanism. Additionally, the planar regions of the semiconductor laser disclosed by Givens, et. al., were only 5-$\mu$m wide so as to further limit the percentage of the aperture filled and the thus restrict the laser's power.

SUMMARY OF THE INVENTION

There is provided by this invention a semiconductor laser device which allows full-aperture operation so as to have 100% of the aperture filled. This device utilizes a corrugated substrate with the etch depths designed to align the quantum well with adjacent absorbing regions which will restrict lateral amplified spontaneous emissions without the disadvantages and deficiencies of the prior art. The device allows for large planar segments to be utilized which provides for full-aperture operation since the broad planar segments are large in comparison to the wavelength and diffusions length which influence possible index-guiding at the structural discontinuities. For device geometries with very large planar segments, diffraction losses will prevent inter-segment coupling so that the alignment of the emitters with an adjacent absorbing region is not as critical.

DESCRIPTION OF THE PREFERRED EMBODIMENT

Figure 1:
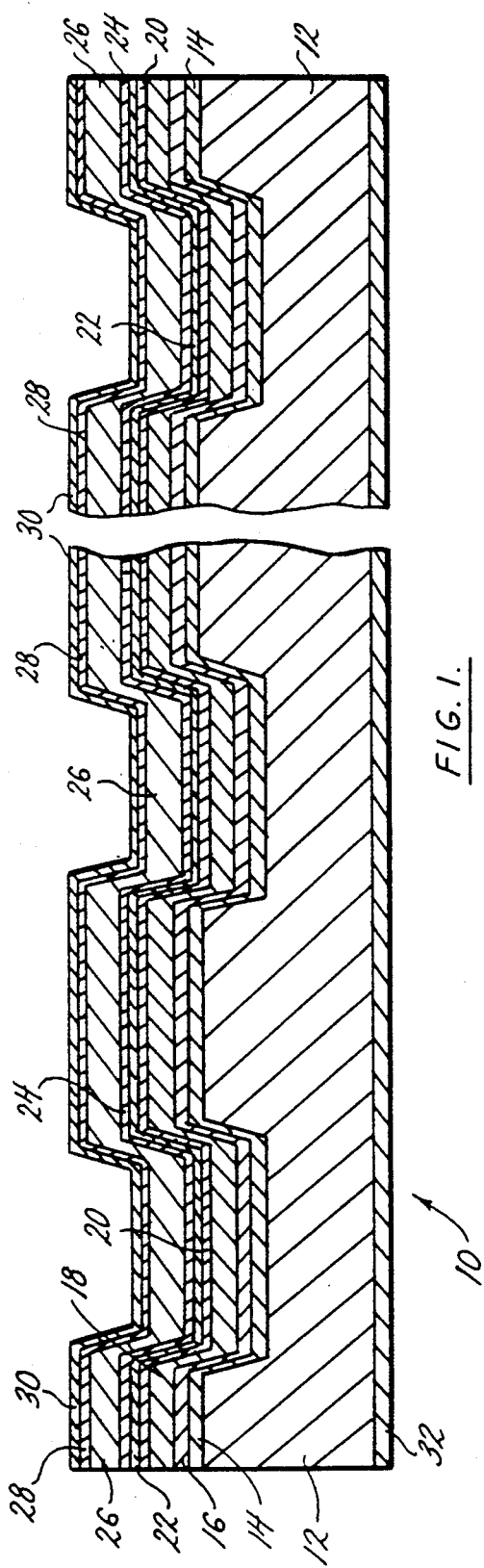
FIG. 1 illustrates a semiconductor laser device with a plurality of planar segments for full-aperture operation.

FIG. 1 shows a semiconductor laser device 10 which incorporates the principles of this invention. Utilizing metalorganic chemical vapor deposition on an GaAs:Si substrate 12, a plurality of striped channels having a width of 200 $\mu$m and a depth of 2 $\mu$m are formed by wet etching. A GaAs buffer layer 14, an $Al_{0.15}Ga_{0.85}As$ buffer layer 16, an $Al_{0.60}Ga_{0.40}As$ cladding layer 18 that is doped with Se, and a $Al_xGa_{1-x}As$ confinement layer 20 precede a 100 angstrom deep GaAs quantum well 22, followed by an $Al_xGa_{1-x}As$ confinement layer 24, an $Al_{0.60}Ga_{0.40}As$ cladding layer 26 that is doped with Zn, and a P+-GaAs contact layer 28 completing the structure. Then, on the surface of the contact layer 28, a p-side electrode 30 is formed with a blanket metalization of Ti/Pt/Au. On the backface of the substrate 12, a n-side electrode 32 is formed with a blanket metalization of Au/Ni/Ge. The semiconductor structure is then cleaved into 2 mm wide bars by scribing from the substrate side to minimize damage at the sidewalls, which are not remote from the active area as would normally be the case. The cavity length is 600 $\mu$m. The device is then bonded junction-side up to a copper heat sink with In solder with the facets remaining uncoated.

The large planar sections, 200 $\mu$m in width, assure uniform emission since the planar sections are large in comparison to the wavelength and diffusion length. Smaller planar sections with dimensions comparable to the wavelength and diffusion length would encourage index-guiding at the structural discontinuities as in the prior art. By selecting an appropriate etch depth, 2 $\mu$m in this instance, the GaAs quantum well 22, is aligned with an absorbing GaAs region 14 or a Ti/Pt/Au metalization 30 on either side to prevent coupling between alternative sections. This alignment of the quantum well 22 with absorbing regions further suppresses lateral lasing and optimizes performance. When the spacing between the planar sections is very large, diffractive losses will suffice to suppress lateral coupling so that the emitter's alignment with the absorbing regions is not as critical. However, some corrugation is still necessary in order to introduce losses at the waveguide bends so as to spoil the continuous waveguide.

Figure 2:
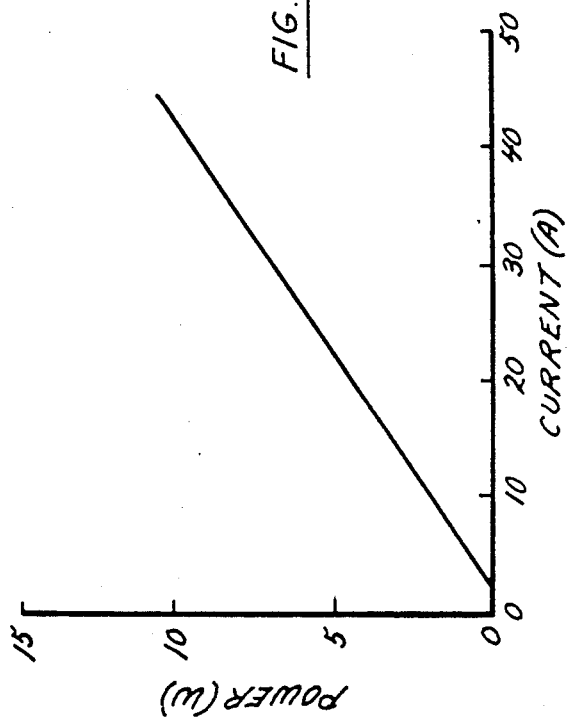
FIG. 2 is a graph illustrating the relationship between the optical output and the current characteristic of the semiconductor laser device shown in FIG. 1.

The optical output and current relationship for the uncoated device with a 2-mm-wide aperture and a 600-$\mu$m-long cavity is shown in FIG. 2, where it is seen that the behavior is linear to the current limit, due to instrumentation limits of 45 A. The threshold current density is measured to be 208 A/cm$^2$ which is approximately equivalent to that of low power quantum well lasers. From FIG. 2, it is seen that the single-ended uncoated slope efficiency is 0.25 W/A which persists to the current limit where 10.7 W is obtained. These measurements along with direct measurements confirm that the loss to lateral amplified spontaneous emission is small. Additionally, the in-plane far field was found to have a 22° full width at half maximum.

Although there has been illustrated and described specific detail and structure of operations, it is clearly understood that the same were merely for purposes of illustrations and that changes and modifications may be readily made there by those skilled in the art without departing from the spirit and the scope of this invention.

I claim:

1. A semiconductor laser array, comprising:
   (a) a substrate having a plurality of striped channels defined by corrugations in the substrate;
   (b) a plurality of semiconductor layers deposited on an absorbing GaAs buffer layer deposited on the substrate in a longitudinal direction wherein at least one active region is defined between n-type and p-type confinement layers, the active region and the confinement layers being positioned between n-type and p-type cladding layers;
   (c) the plurality of semiconductor layers having a p-n junction therein transverse to the direction of the active layer wherein radiation is produced in the active layer when electric current is produced across the p-n junction;
   (d) electrical means for producing an electrical current across the p-n junction; and
   (e) the striped channels having a depth profile wherein the corrugations divide the plurality of semiconductor layers into a plurality of laser emitters on the substrate in the longitudinal direction such that an active region for an individual emitter is aligned with an absorbing GaAs buffer layer or a metalization on either side to prevent coupling between alternative emitters.

2. A semiconductor laser array as recited in claim 1 wherein the striped channels are approximately 200 μm wide.

3. A semiconductor laser array as recited in claim 2 wherein the striped channels are approximately 2 μm deep.

4. A semiconductor laser array as recited in claim 3 wherein the active regions are 600 μm long.

5. A semiconductor laser as recited in claim 4 wherein the active regions are 200 μm wide.

* * * * *